United States Patent
Wang et al.

(10) Patent No.: US 8,769,458 B2
(45) Date of Patent: *Jul. 1, 2014

(54) PROTOTYPE VERIFICATION SYSTEM AND VERIFICATION METHOD FOR HIGH-END FAULT-TOLERANT COMPUTER

(75) Inventors: Endong Wang, Beijing (CN); Leijun Hu, Beijing (CN); Rengang Li, Beijing (CN)

(73) Assignee: Inspur (Beijing) Electronic Information Industry Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/002,817

(22) PCT Filed: Mar. 2, 2012

(86) PCT No.: PCT/CN2012/071844
§ 371 (c)(1),
(2), (4) Date: Sep. 3, 2013

(87) PCT Pub. No.: WO2012/116654
PCT Pub. Date: Sep. 7, 2012

(65) Prior Publication Data
US 2013/0346933 A1 Dec. 26, 2013

(30) Foreign Application Priority Data
Mar. 3, 2011 (CN) .......................... 2011 1 0051252

(51) Int. Cl.
*G06F 17/50* (2006.01)
(52) U.S. Cl.
USPC ......................................................... 716/110
(58) Field of Classification Search
USPC ................................................ 716/100, 110
See application file for complete search history.

(56) References Cited

U.S. PATENT DOCUMENTS 4,968,977 A * 11/1990 Chinnaswamy et al. .... 340/2.24
7,185,138 B1 * 2/2007 Galicki ......................... 710/316
(Continued)

FOREIGN PATENT DOCUMENTS

CN         1742259 A      3/2006
CN       101136036        3/2008
(Continued)

OTHER PUBLICATIONS

International Search Report for PCT/CN2012/071844, English translation attached to original, Both completed by the Chinese Patent Office on Apr. 28, 2012, All together 5 Pages.

(Continued)

*Primary Examiner* — Suchin Parihar
(74) *Attorney, Agent, or Firm* — Brooks Kushman P.C.

(57) ABSTRACT

A prototype verification system and method are provided for a high-end fault-tolerant computer. The system includes multiple single junction prototype verification systems and an interconnection router chipset. The single junction prototype verification systems are interconnected through the interconnection router chipset. Each single junction prototype verification system includes a computer board which is a four-path tightly-coupled computer board, and a chip verification board including two junction controller chipsets. Each junction controller chipset includes two field-programmable gate array (FGPA) chips which bear a logic of one junction controller together, and an interconnection board including two FGPA chips. Each FPGA chip provides a high speed interconnection port used to achieve protocol interconnection between two paths of the computer board and one of the junction controller chipsets.

14 Claims, 2 Drawing Sheets

(56) References Cited

U.S. PATENT DOCUMENTS

| | | | | |
|---|---|---|---|---|
| 7,191,380 | B2* | 3/2007 | Kuekes et al. | 714/758 |
| 7,310,004 | B2* | 12/2007 | DeHon | 326/41 |
| 7,495,942 | B2* | 2/2009 | Davis et al. | 365/49.1 |
| 8,510,239 | B2* | 8/2013 | Modha | 706/14 |

FOREIGN PATENT DOCUMENTS

| | | |
|---|---|---|
| CN | 101216815 A | 7/2008 |
| CN | 101330413 A | 12/2008 |
| CN | 101354694 A | 1/2009 |
| CN | 102122259 | 7/2011 |
| CN | 102129418 | 7/2011 |
| CN | 102129418 A | 7/2011 |
| CN | 202122259 A | 7/2011 |
| CN | 102142050 | 8/2011 |
| CN | 102142050 A | 8/2011 |
| JP | 2000122890 | 4/2000 |

OTHER PUBLICATIONS

State Intellectual Property Office of the P.R. China, International Search Report for the corresponding International Application No. PCT/CN2012/071956 mailed May 31, 2012.

United States Patent & Trademark Office, Office Action for U.S. Appl. No. 14/002,827 mailed Jan. 9, 2014.

* cited by examiner

PROTOTYPE VERIFICATION SYSTEM AND VERIFICATION METHOD FOR HIGH-END FAULT-TOLERANT COMPUTER

CROSS-REFERENCE TO RELATED APPLICATION

This application is the U.S. national phase of PCT Appln. No. PCT/CN2012/071844 filed Mar. 2, 2012 which claims priority to Chinese Application No. 201110051252.3 filed Mar. 3, 2011, the disclosure of which are incorporated in their entirety by reference herein.

TECHNICAL FIELD

The present invention relates to the field of high-end computer design, and in particular, to a prototype verification system and verification method for a high-end fault-tolerant computer.

BACKGROUND OF THE RELATED ART

With the development at full speed of the computer technology, in order to meet the demands of the economic society development, high performance and high reliability computer system becomes one of the bottlenecks restricting the key field of the social development. The information fields, such as bulky data calculation and data analysis, complicated graphic analysis and scientific computation, etc., have extremely high requirement on the performance of the computer system. Therefore, the bulky multi-channel computer system needs to be constructed, so as to meet the application demand in the current various fields; but on the other hand it also fell into the technical problem of design and verification of the multi-channel computer system; that is, in order to improve the performance, the number of processors of the computer system is increasing constantly, which needs the bulky-logic junction controller chipset and the crossbar interconnection router chipset to finish the system interconnection. Both the structure design of the complicated computer system and the large-scale integrated circuit chipset design brought challenges to the verification work of the high-end fault-tolerant computer system.

SUMMARY OF THE INVENTION

The technical problem that the present invention requires to solve is to provide a prototype verification system and verification method for a high-end fault-tolerant computer, which can increase the coverage of the system interconnection chipsets protocol verification greatly and reduce the project verification cost greatly on the basis of ensuring system performance and reliability.

In order to solve the above-mentioned technical problem, the present invention provides a prototype verification system for a high-end fault-tolerant computer, comprising a plurality of single junction prototype verification systems and an interconnection router chipset; wherein, the plurality of single junction prototype verification systems are interconnected with each other through the interconnection router chipset; wherein, each single junction prototype verification system comprises:

a computer board, which is a four-path tightly-coupled computer board;

a chip verification board, comprising two junction controller chipsets; wherein, each junction controller chipset comprises: two field-programmable gate array (FGPA) chips which bear a logic of one junction controller together; and an interconnection board, comprising two FGPA chips; wherein, each FPGA chip provides a high speed interconnection port used to achieve protocol interconnection between two paths of the computer board and one of the junction controller chipsets.

The four-path tightly-coupled computer board comprises 4 CPUs, wherein, the 4 CPUs are interconnected internally, and share memories with each other; and All CPUs in the plurality of the single junction prototype verification systems are interconnected with each other through the interconnection router chipset, and share memories.

The logic of the junction controller comprises: cache consistency control and internet interface control.

The chip verification board has a network interface (NI); and the plurality of the single junction prototype verification systems are connected with the interconnection router chipset through the NIs on their own chip verification boards.

The number of the plurality of the single junction prototype verification systems is 4.

In order to solve the above-mentioned technical problem, the present invention further provides a prototype verification method for a high-end fault-tolerant computer, comprising selecting a computer board, wherein, the computer board is a four-path tightly-coupled computer board;

selecting a chip verification board which comprises two junction controller chipsets; wherein, each junction controller chipset comprises: two field-programmable gate array (FGPA) chips which bear a logic of one junction controller together;

selecting an interconnection board which comprises two FGPA chips; wherein, each FPGA chip provides a high speed interconnection port used to achieve protocol interconnection between two paths of the computer board and one of the junction controller chipsets;

connecting 2 paths in the computer board to one junction controller chipset in the chip verification board through one FPGA chip in the interconnection board, and connecting other 2 paths in the computer board to another junction controller chipset in the chip verification board through another FPGA chip in the interconnection board, thus forming a single junction prototype verification system;

interconnecting a plurality of the single junction prototype verification systems by using an interconnection router chipset; and executing the logic of a junction controller borne by the plurality of the single junction prototype verification systems, and verifying validity of the logic according to an execution result.

The four-path tightly-coupled computer board comprises 4 CPUs, wherein, the 4 CPUs are interconnected internally, and share memories with each other; and All CPUs in the plurality of the single junction prototype verification systems are interconnected with each other through the interconnection router chipset, and share memories.

The logic of the junction controller comprises: cache consistency control and internet interface control.

The chip verification board has a network interface (NI); and the step of interconnecting the plurality of the single junction prototype verification systems comprises: connecting the plurality of the single junction prototype verification systems with the interconnection router chipset through the NIs on their own chip verification boards.

In the step of interconnecting the plurality of the single junction prototype verification systems, the number of the single junction prototype verification systems is 4.

A prototype verification system and verification method for a high-end fault-tolerant computer provided by the present invention realizes the multi-CPU system integration, realizes the global memory sharing effectively, balances the system transmission bandwidth and delay, and solves the problem of the verification complexity of the multi-CPU system integration design effectively, which increases the system verification coverage and the system key chipset verification coverage greatly on the basis of saving cost and design verification time, and has very high technical value.

PREFERRED EMBODIMENTS OF THE PRESENT INVENTION

The embodiment of the present invention is described in detail with reference to the accompanying drawings hereinafter.

Figure 1:
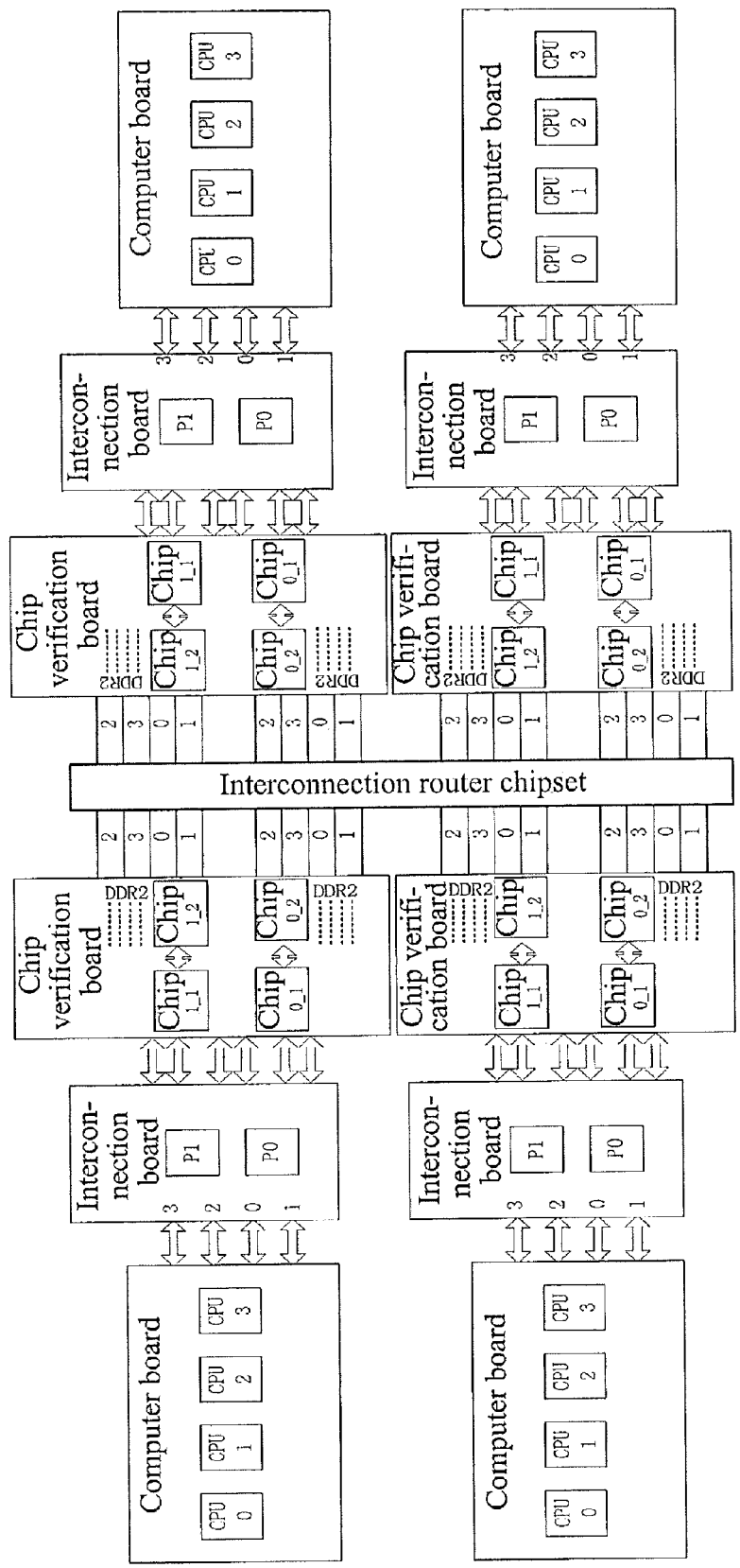
FIG. 1 is a block diagram of a prototype verification system for a high-end fault-tolerant computer according to an embodiment of the present invention.

Referring to FIG. 1, the figure shows a prototype verification system for a high-end fault-tolerant computer, including a plurality of single junction prototype verification systems and an interconnection router chipset; wherein, the plurality of single junction prototype verification systems are interconnected with each other through the interconnection router chipset; wherein, the single junction prototype verification system includes:

a computer board, which is a four-path tightly-coupled computer board;

a chip verification board, including two junction controller chipsets; wherein, each junction controller chipset includes: two field-programmable gate array (FGPA) chips which bear the logic of one junction controller together; and an interconnection board, including two FGPA chips; wherein, each FPGA chip provides a high speed interconnection port used to achieve protocol interconnection between two paths of the computer board and one of the junction controller chipsets.

Wherein, the four-path tightly-coupled computer board includes 4 CPUs, wherein, the 4 CPUs are interconnected internally and share memories with each other; and all CPUs in the plurality of the single junction prototype verification systems are interconnected with each other through the interconnection router chipset and share memories.

Wherein, the logic of the junction controller includes: cache consistency control and internet interface control.

Wherein, the 2 FPGA chips of the interconnection board further can provide various debugging means and testing methods for the verification work besides realizing the logic of the physical layer and guaranteeing the interconnection link handshaking initialization and the signal transmission quality.

Wherein, the interconnection router chipset can, through a high speed interface, such as a PCIe interface, a Network Interface (NI) Interface, an optical interface, an AMD HT interface, an Intel QPI interface, and other protocol interfaces developed independently, realize the internal interconnection of the plurality of the single junction prototype verification systems, realize the multi-CPU system integration, and realize the global memory sharing effectively, which solves the problem of the verification complexity of ultra large scale integrated circuit design in the multi-CPU system effectively, realizes the requirement on the system performance of the high-end computer on the basis of guaranteeing the system verification of the computer and the key chipset verification of the high-end server, and has very high technical value. The board-level multistage interconnection provides a large number of debugging interfaces and verification means for the debugging and verification at the same time, reduces the difficulty and complexity of the verification greatly, saves the development cost of the project, and shortens the project development cycle.

The present invention adopts the multi-cell board interconnection mode to realize the large scale junction controller chipset FPGA verification ingeniously, and works out the single junction prototype verification system described in the above-mentioned embodiment finally through in-depth study and trial and error, and it is a four-path single junction system, wherein:

when the minimum calculation unit of the system is selected, from the point of view of realizing the optimization, it is fully considered that more than four paths will increase the computer board scale while against plate making and less than four paths will increase the computer board quantity while against the whole system integration, therefore, the four-path tightly-coupled computer board is selected as the minimum calculation unit of the system after overall consideration.

The independent design logic verification unit, that is, the junction controller chipset, realizes the system Cache consistency control and the internet interface control: realizing the logic of one junction controller chipset through adopting two high-capacity high-end FPGA chips, thus effectively guaranteeing the FPGA verification coverage of the junction controller chipset, guaranteeing to perform the overall verification on the junction controller logic, and laying a foundation for realizing the chip Application-Specific Integrated Circuit (ASIC). Wherein, on the basis of the design specification and interface of the selected computational element (that is, the four-path tightly-coupled computer board), two junction controller chipsets are required to be configured for the computing element, which are responsible for the interconnection of the two-path CPUs respectively.

On the basis of the design specification and interface of the selected computing element (that is, the four-path tightly-coupled computer board), four-port interconnection single board is selected to complete the four-port protocol interconnection of the computing element and the logic verification element; two high speed interconnection ports are provided by two high-end FPGA chips respectively, thus guarantying the high speed interconnection protocol of the overall system and providing abundant debugging interface and verification means for the logic verification.

The above-mentioned single junction prototype verification system also has very good expansibility, and is able to cascade the plurality of the above-mentioned single junction prototype verification systems conveniently, thus realizing the multi-CPU system integration, realizing the global memory sharing effectively, solving the problem of the verification complexity of ultra large scale integrated circuit design in the multi-CPU system effectively, and having very high technical value.

Further, in order to improve the system performance, reduce the design difficulty and the design complexity, and improve the reusability characteristic of the design, in the present invention, aiming at the structural features of the high integration density of the multi-channel computer system and on the basis of the above-mentioned single junction prototype verification system, it is to adopt the system interconnection router chipset to realize the internal interconnection of the plurality of the isomorphic single junction prototype verification systems, thus realizing the design requirement of the tightly-coupled shared memory. Meanwhile, the symmetrical isomorphic structures of the plurality of the single junction prototype verification systems realize the same step length of the exchange visiting among the system processors, and guarantee the performance of the tightly-coupled shared memory system; and the symmetrical isomorphic structures also reduce the design complexity of the multi-channel system greatly and improve the reusability of the design.

Preferably, fully considering the system efficiency, the design complexity and the cost, from the point of view of realizing the optimization, after the trial and error and comparison, the present invention further provides a most reasonable and minimum prototype verification system, that is, four single junction prototype verification systems are selected to form a four-junction 16-path prototype verification system by adopting the above-mentioned way. This is put forward by the chipset function which requires to be verified, and after the trial and error and the comparison, it is found that the verification coverage is very low if the verification system is smaller than 16 paths and the verification coverage is very high if greater than 16 paths; the 16-path system can be selected as the optimal and minimum prototype verification system after overall consideration. The four-junction sixteen-path minimum verification system is based on the single junction four-path prototype verification system, analyzes the structural feature of the interconnection chipset and the protocol processing capacity and processing mechanism, and expands and realizes the 16-path minimum prototype verification system; 8 junction controller chipsets in the whole 16-path system realize the Cache consistency control and the internet interface control of the whole system. Thus on the basis of guaranteeing the system performance and reliability, the coverage of the system interconnection chipset protocol verification is increased greatly, and the project verification cost is reduced greatly.

Figure 2:
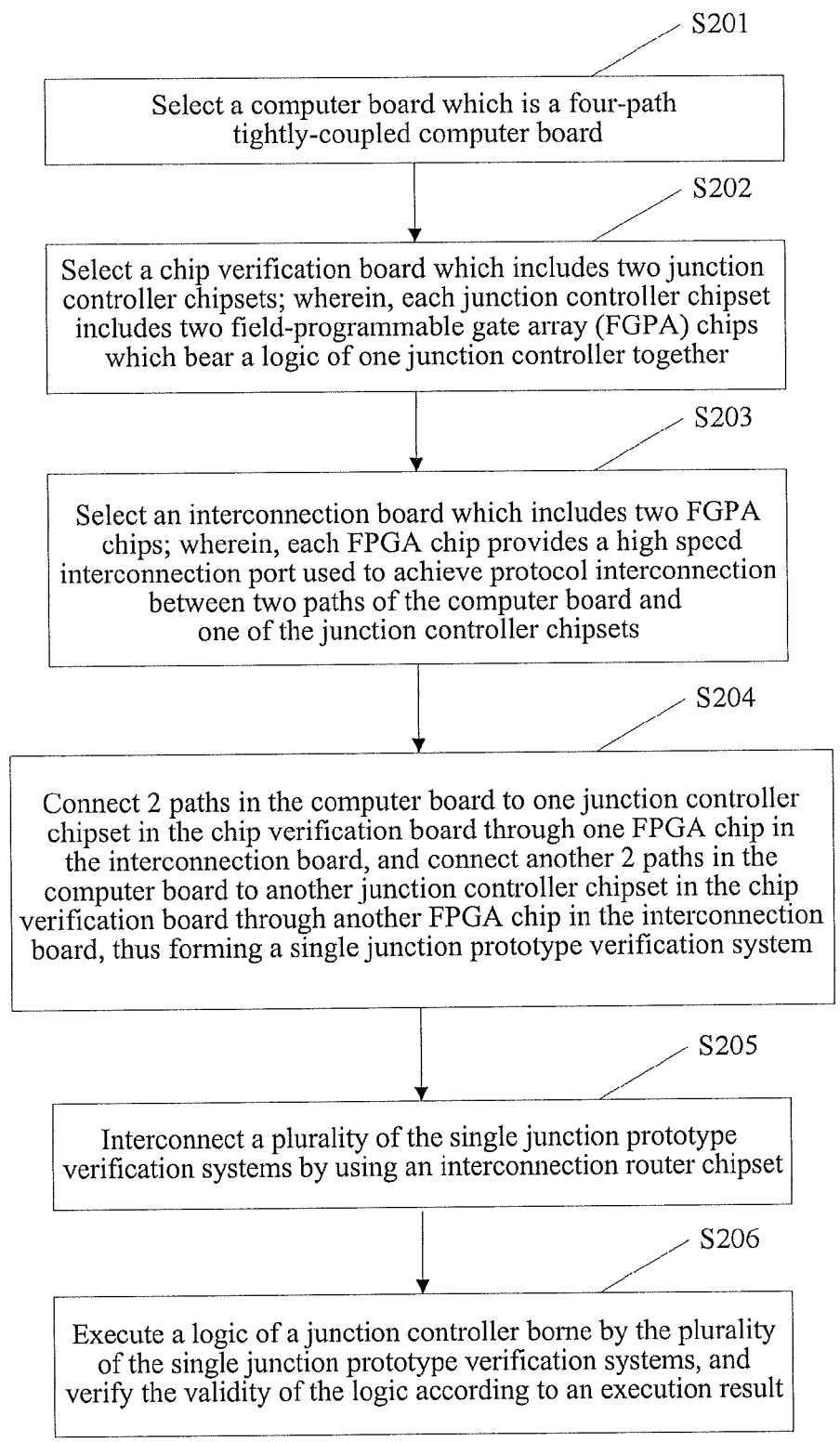
FIG. 2 is a flow chart of a of a prototype verification method for a high-end fault-tolerant computer according to an embodiment of the present invention.

The embodiment of the present invention further provides a prototype verification method for a high-end fault-tolerant computer, as shown in FIG. 2, including:

in step 201: a computer board is selected, wherein, the computer board is a four-path tightly-coupled computer board;

the four-path tightly-coupled computer board includes 4 CPUs, which are interconnected internally and share memories with each other;

in step 202: a chip verification board is selected, which includes two junction controller chipsets; wherein, each junction controller chipset includes two field-programmable gate array (FGPA) chips which bear the logic of one junction controller together;

the logic of the junction controller includes: cache consistency control and internet interface control;

in step 203: an interconnection board is selected, which includes two FGPA chips; wherein, each FPGA chip provides a high speed interconnection port used to achieve protocol interconnection between two paths of the computer board and one of the junction controller chipsets;

in step 204: 2 paths in the computer board are connected to one junction controller chipset in the chip verification board through one FPGA chip in the interconnection board, and other 2 paths in the computer board are connected to another junction controller chipset in the chip verification board through another FPGA chip in the interconnection board, thus forming a single junction prototype verification system;

in step 205: a plurality of the single junction prototype verification systems are interconnected by using an interconnection router chipset;

wherein, all CPUs in the plurality of the single junction prototype verification systems are interconnected with each other through the interconnection router chipset, and share memories;

in step 206: the logic of a junction controller borne by the plurality of the single junction prototype verification systems is executed, and the validity of the logic is verified according to an execution result.

Wherein, when step 205 is executed, the interconnection router chipset can, through a high speed interface, such as a PCIe interface, a Network Interface (NI) Interface, an optical interface, an AMD HT interface, an Intel QPI interface, and other protocol interfaces developed independently, realize the internal interconnection of the plurality of the single junction prototype verification systems, realize the multi-CPU system integration, and realize the global memory sharing effectively.

Wherein, when step 205 is executed, four single junction prototype verification systems can be selected to form the four junction 16-path prototype verification system.

Certainly, the present invention can have other various embodiments. Those skilled in the art can make the corresponding modifications and variations according to the present invention without departing from the spirit and essence of the present invention. And all of these modifications or the variations should be embodied in the scope of the appended claims of the present invention.

Industrial Applicability

Compared with the related art, the present invention realizes the multi-CPU system integration, realizes the global memory sharing effectively, balances the system transmission bandwidth and delay, and solves the problem of the verification complexity of the multi-CPU system integration design effectively, which increases the system verification coverage and the system key chipset verification coverage greatly on the basis of saving cost and design verification time, and has very high technical value.

What we claim is:

1. A prototype verification system for a high-end fault-tolerant computer, comprising a plurality of single junction prototype verification systems and an interconnection router chipset; wherein, the plurality of single junction prototype verification systems are interconnected with each through the interconnection router chipset; wherein, each single junction prototype verification system comprises:

a computer board, which is a four-path tightly-coupled computer board;

a chip verification board, comprising two junction controller chipsets; wherein, each junction controller chipset comprises: two field-programmable gate array (FPGA) chips which bear a logic of a junction controller together; and an interconnection board, comprising two FPGA chips; wherein, each FPGA chip provides a high speed interconnection port used to achieve protocol interconnection between two paths of the computer board and one of the junction controller chipsets;

wherein the four-path tightly-coupled computer board comprises 4 CPUs, the 4 CPUs are interconnected internally, and share memories with each other; and all CPUs in the plurality of the single junction prototype verification systems are interconnected with each other through the interconnection router chipset, and share memories.

2. The system according to claim 1, wherein, the logic of the junction controller comprises: cache consistency control and internet interface control.

3. The system according to claim 1, wherein, the chip verification board has a network interface (NI); and the plurality of the single junction prototype verification systems are connected with the interconnection router chipset through the NIs on the chip verification boards thereof respectively.

4. The system according to claim 1, wherein, a number of the plurality of the single junction prototype verification systems is 4.

5. A prototype verification method for a high-end fault-tolerant computer, comprising selecting a computer board which is a four-path tightly-coupled computer board;

selecting a chip verification board which comprises two junction controller chipsets;

wherein, each junction controller chipset comprises: two field-programmable gate array (FPGA) chips which bear a logic of a junction controller together;

selecting an interconnection board which comprises two FPGA chips; wherein, each FPGA chip provides a high speed interconnection port used to achieve protocol interconnection between two paths of the computer board and one of the junction controller chipsets;

connecting 2 paths in the computer board to one junction controller chipset in the chip verification board through one FPGA chip in the interconnection board, and connecting another 2 paths in the computer board to another junction controller chipset in the chip verification board through another FPGA chip in the interconnection board, thus forming a single junction prototype verification system;

interconnecting a plurality of the single junction prototype verification systems by using an interconnection router chipset; and executing the logic of the junction controller borne by the plurality of the single junction prototype verification systems, and verifying validity of the logic according to an execution result;

wherein the four-path tightly-coupled computer board comprises 4 CPUs which are interconnected internally and share memories with each other; and all CPUs in the plurality of the single junction prototype verification systems are interconnected with each other through the interconnection router chipset, and share memories.

6. The method according to claim 5, wherein, the logic of the junction controller comprises: cache consistency control and internet interface control.

7. The method according to claim 5, wherein, the chip verification board has a network interface (NI); and the step of interconnecting the plurality of the single junction prototype verification systems comprises: connecting the plurality of the single junction prototype verification systems with the interconnection router chipset through the NIs on the chip verification boards thereof respectively.

8. The method according to claim 5, wherein, in the step of interconnecting the plurality of the single junction prototype verification systems, a number of the single junction prototype verification systems is 4.

9. The system according to claim 1, wherein, a number of the plurality of the single junction prototype verification systems is 4.

10. The system according to claim 2, wherein, a number of the plurality of the single junction prototype verification systems is 4

11. The system according to claim 3, wherein, a number of the plurality of the single junction prototype verification systems is 4.

12. The method according to claim 5, wherein, in the step of interconnecting the plurality of the single junction prototype verification systems, a number of the single junction prototype verification systems is 4.

13. The method according to claim 6, wherein, in the step of interconnecting the plurality of the single junction prototype verification systems, a number of the single junction prototype verification systems is 4.

14. The method according to claim 7, wherein, in the step of interconnecting the plurality of the single junction prototype verification systems, a number of the single junction prototype verification systems is 4

* * * * *